(12) United States Patent
Rinck et al.

(10) Patent No.: US 9,960,135 B2
(45) Date of Patent: May 1, 2018

(54) METAL BOND PAD WITH COBALT INTERCONNECT LAYER AND SOLDER THEREON

(71) Applicant: Texas Instruments Incorporated, Dallas, TX (US)

(72) Inventors: Helmut Rinck, Moosburg (DE); Gernot Bauer, Moosburg (DE); Robert Zrile, Munich (DE); Kai-Alexander Schachtschneider, Rohrbach (DE); Michael Otte, Moosburg (DE); Harald Wiesner, Landshut (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days. days.

(21) Appl. No.: 14/665,799

(22) Filed: Mar. 23, 2015

(65) Prior Publication Data

US 2016/0284656 A1 Sep. 29, 2016

(51) Int. Cl.
*H01L 21/28* (2006.01)
*H01L 23/00* (2006.01)
(Continued)

(52) U.S. Cl.
CPC .......... *H01L 24/13* (2013.01); *H01L 23/5226* (2013.01); *H01L 23/53204* (2013.01);
(Continued)

(58) Field of Classification Search
CPC . H01L 2924/01079; H01L 2924/01029; H01L 2924/01078; H01L 2924/01013; H01L 2924/14; H01L 2224/13099; H01L 23/5329; H01L 23/5226; H01L 23/5222; H01L 2924/01027; H01L 2224/05157; H01L 2224/05657; H01L 2224/13157; H01L 2224/13657; H01L 2224/80457; H01L 2224/81457; H01L 2224/83457; H01L 2224/84457; H01L 2224/85457; H01L 2224/85757; H01L 2224/05457; H01L 2224/05957; H01L 2224/13457; H01L 2224/13957; H01L 2224/29457; H01L 2224/29957
(Continued)

(56) References Cited

U.S. PATENT DOCUMENTS 5,260,234 A 11/1993 Long
6,452,271 B2 9/2002 Jiang et al.
(Continued)

FOREIGN PATENT DOCUMENTS

EP 0616361 B1 7/2000

*Primary Examiner* — Daniel Whalen
(74) *Attorney, Agent, or Firm* — Jacqueline J. Garner; Charles A. Brill; Frank D. Cimino

(57) ABSTRACT

A method of forming bond pads includes providing a substrate including an integrated circuit (IC) device formed thereon having an oxidizable uppermost metal interconnect layer which provides a plurality of bond pads that are coupled to circuit nodes on the IC device. The plurality of bond pads includes a metal bond pad area. A cobalt including connection layer is deposited directly on the metal bond pad area. The cobalt including connection layer is patterned to provide a cobalt bond pad surface for the plurality of bond pads, and a solder material is formed on the cobalt bond pad surface.

17 Claims, 6 Drawing Sheets

(51) Int. Cl.
*H01L 23/522* (2006.01)
*H01L 23/532* (2006.01)

(52) U.S. Cl.
CPC .............. *H01L 24/03* (2013.01); *H01L 24/05* (2013.01); *H01L 24/11* (2013.01); *H01L 2224/03612* (2013.01); *H01L 2224/03622* (2013.01); *H01L 2224/0401* (2013.01); *H01L 2224/05157* (2013.01); *H01L 2224/13014* (2013.01); *H01L 2224/13016* (2013.01); *H01L 2224/13111* (2013.01); *H01L 2224/13139* (2013.01); *H01L 2924/014* (2013.01); *H01L 2924/01022* (2013.01); *H01L 2924/01029* (2013.01); *H01L 2924/10253* (2013.01); *H01L 2924/14* (2013.01); *H01L 2924/2064* (2013.01)

(58) Field of Classification Search
USPC .................... 257/737, 738, 741, 758, 779
See application file for complete search history.

(56) References Cited

U.S. PATENT DOCUMENTS

| | | | |
|---|---|---|---|
| 8,148,822 B2* | 4/2012 | Lin ........................ | H01L 24/11 257/763 |
| 2001/0042918 A1* | 11/2001 | Yanagida ................ | H01L 24/05 257/753 |
| 2004/0096592 A1 | 5/2004 | Chebiam et al. | |
| 2005/0212133 A1* | 9/2005 | Barnak ................... | H01L 24/11 257/738 |
| 2007/0023919 A1* | 2/2007 | Lin ......................... | H01L 24/12 257/774 |
| 2007/0026631 A1* | 2/2007 | Lin ..................... | H01L 23/3157 438/424 |
| 2007/0108633 A1* | 5/2007 | Song ................... | H01L 23/3128 257/786 |
| 2007/0158199 A1* | 7/2007 | Haight ..................... | C25D 3/38 205/80 |
| 2007/0222073 A1* | 9/2007 | Farooq .................. | H01L 24/11 257/738 |
| 2007/0292604 A1* | 12/2007 | Dordi .................. | H01L 21/0206 427/99.5 |
| 2008/0020511 A1* | 1/2008 | Yang ....................... | H01L 24/19 438/110 |
| 2009/0174069 A1* | 7/2009 | Nguyen .................. | H01L 24/05 257/737 |
| 2009/0283903 A1* | 11/2009 | Park ........................ | H01L 24/03 257/737 |
| 2010/0099250 A1* | 4/2010 | Jang ................. | H01L 21/76849 438/614 |
| 2010/0099262 A1 | 4/2010 | Chen et al. | |
| 2013/0292820 A1* | 11/2013 | Kang ...................... | H01L 23/48 257/737 |
| 2015/0270172 A1* | 9/2015 | Purushotaman .. | H01L 21/76898 438/108 |
| 2015/0371939 A1* | 12/2015 | Yang ................ | H01L 23/53238 257/751 |
| 2016/0240500 A1* | 8/2016 | Huang .................... | H01L 24/13 |

* cited by examiner

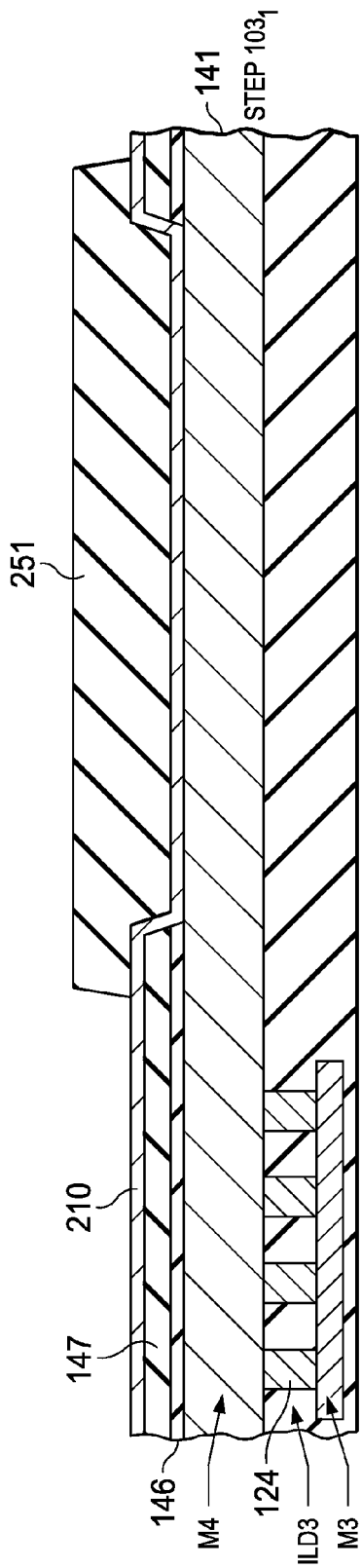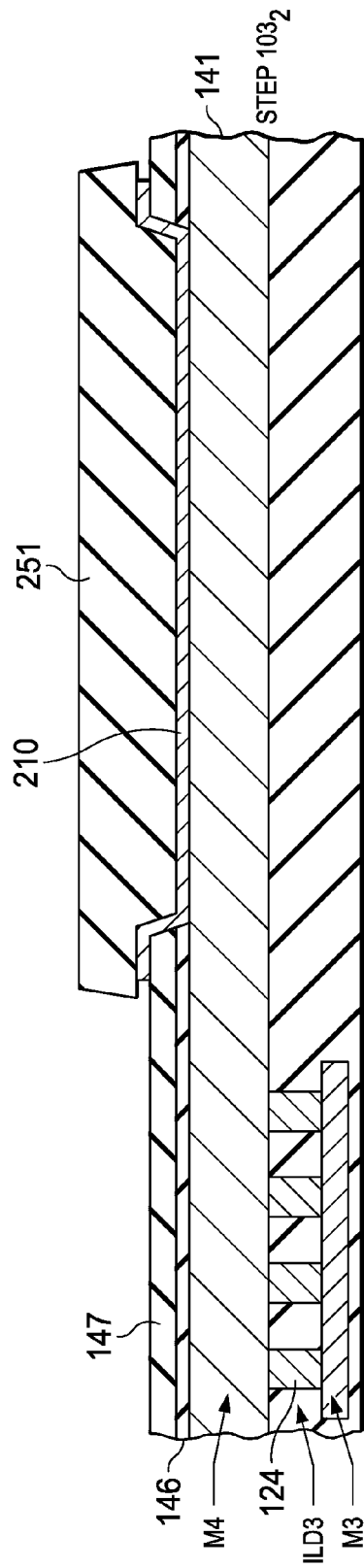

METAL BOND PAD WITH COBALT INTERCONNECT LAYER AND SOLDER THEREON

FIELD

Disclosed embodiments relate to bond pads for integrated circuits.

BACKGROUND

Integrated circuits (IC) devices are usually fabricated on semiconductor wafers which have a plurality of IC device die each including bond pads on its top surface that connect to various nodes in the device, such as for signal input, signal output and power supply nodes. The bond pads are generally connected by a bond wire of a lead frame or other electrically conductive structure such as a contact pad on a support such a printed circuit board (PCB) to permit utilization of the IC die. Known methods for connecting an IC device to a lead frame or other support include wire bonding, Tape Automated Bonding (TAB), Controlled Collapse Chip Connection (C4) or bump bonding, and electrically conductive adhesives.

To provide a reliable and low electrical resistance attachment to the bond pad surface, some packaging technologies have used multi-layered bond pads having a top metal layer that is both electrically conductive and resistant to oxidation to provide high reliability (good corrosion performance) and high performance (low resistance). One such bond pad arrangement deposits a dielectric passivation layer(s) over an oxidizable uppermost metal interconnect layer such as copper or aluminum, and then forms a trench including dielectric sidewalls from the passivation layer. A barrier layer comprising a refractory metal (e.g., Ta, TaN, or Ti) is then deposited that lines the passivation sidewalls which provides good adhesion to the passivation material. A multi-layer metal stack is formed on the barrier layer which in one particular embodiment can comprise palladium (Pd) as the final (top) layer on a nickel layer over the uppermost metal interconnect layer to provide a stable surface for wire bonding. Pd being a platinum group metal has a low propensity for oxidation and is a good outer capping layer for the bond pad to prevent chemical attack of the oxidizable uppermost metal interconnect layer material thereunder.

Some IC devices have aluminum bond pads. Solder bumping on aluminum is known to generally not be possible due to aluminum oxide formation during the soldering process which prevents solder adhesion. As a result, conventional solder bump processes for soldering to aluminum bond pads generally require forming a complex stack on the aluminum including a refractory-metal based barrier layer then a copper seed, followed by an electroplated copper redirect layer (RDL) then under bump metallization (UBM) thereon, where the solder bump (or ball) is then formed on the UBM.

SUMMARY

This Summary is provided to introduce a brief selection of disclosed concepts in a simplified form that are further described below in the Detailed Description including the drawings provided. This Summary is not intended to limit the claimed subject matter's scope.

Disclosed embodiments include methods for forming bond pads on integrated circuits (ICs) which include forming a cobalt comprising connection layer directly on the metal bond pad area for oxidizable metals or a non-solderable material (e.g., Ti, TiN, TiW, or $TiAl_3$) that has been found to allow forming solder material (e.g., solder bumps) directly on the cobalt comprising connection layer. Disclosed methods thus allow solder bumping directly after wafer fab processing without the conventional need after wafer fabrication as described above for adding a complex metal stack including a refractory-metal based barrier layer, copper seed and redirect layer (RDL), then under bump metallization (UBM) processing.

Disclosed methods include providing a substrate (e.g., a wafer) including at least one integrated circuit (IC) device formed thereon having an oxidizable uppermost metal interconnect layer which provides a plurality of bond pads coupled to circuit nodes on the IC device, where the plurality of bond pads include a metal bond pad area. The oxidizable uppermost metal interconnect can comprise aluminum. A cobalt comprising connection layer is deposited (e.g., sputtered) directly on the metal bond pad area. The cobalt comprising connection layer is patterned to provide a cobalt bond pad surface on the bond pads, and a solder material (e.g., solder bumps or balls) is then formed on the cobalt bond pad surface. As a result, disclosed embodiments provide a new bond pad stack, in the case for the oxidizable uppermost metal interconnect comprising aluminum, the bond pad stack is aluminum-cobalt-solder (e.g., Al—Co—SnAg).

BRIEF DESCRIPTION OF THE DRAWINGS

Reference will now be made to the accompanying drawings, which are not necessarily drawn to scale, wherein:

FIGS. 2A-2F show successive cross section depictions corresponding to the structures associated with the method shown and described relative to in FIG. 1.

DETAILED DESCRIPTION

Figure 1:
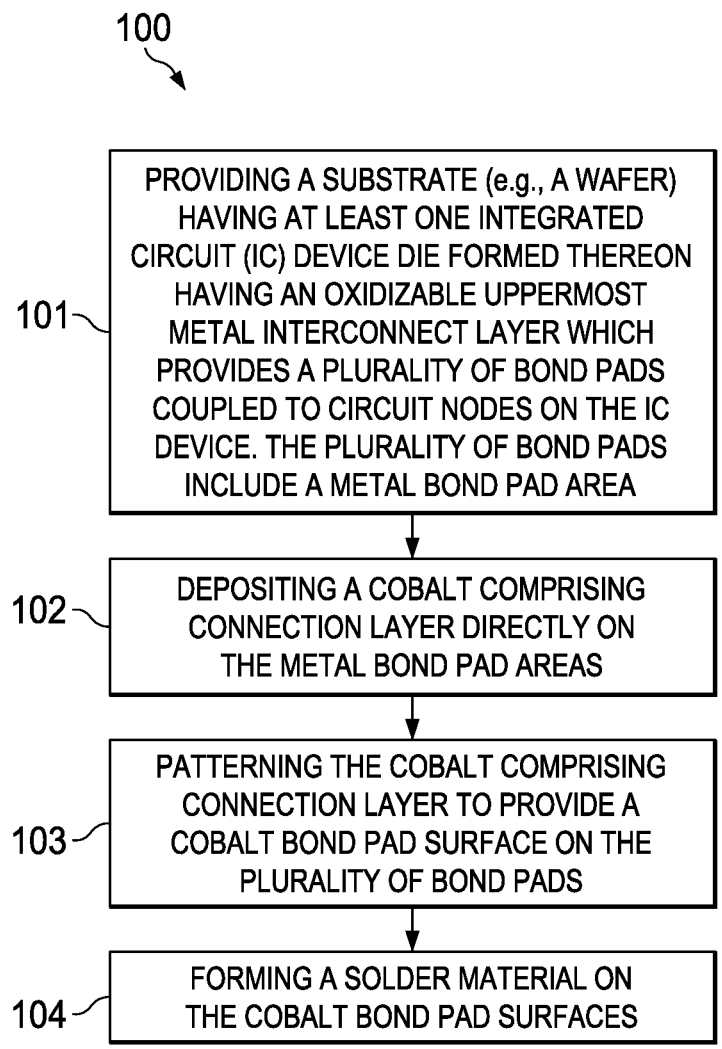
FIG. 1 is a flow chart that shows steps in an example method for forming bond pads having a metal bond pad area of oxidizable uppermost metal interconnect layer of an IC device including a cobalt comprising connection layer directly on the metal bond pad area to provide a cobalt bond pad surface, with a solder material on the cobalt bond pad surfaces, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

FIG. 1 is a flow chart that shows steps in an example method 100 for forming a cobalt comprising connection layer directly on a metal bond pad area of oxidizable uppermost metal interconnect layer of an IC device to form a cobalt bond pad surface, and then solder material on the cobalt bond pad surface, according to an example embodiment. Step 101 comprises providing a substrate (e.g., a wafer) having least one IC device die formed thereon having an oxidizable uppermost metal interconnect layer which provides a plurality of bond pads coupled to circuit nodes on the IC device.

Figure 2A:
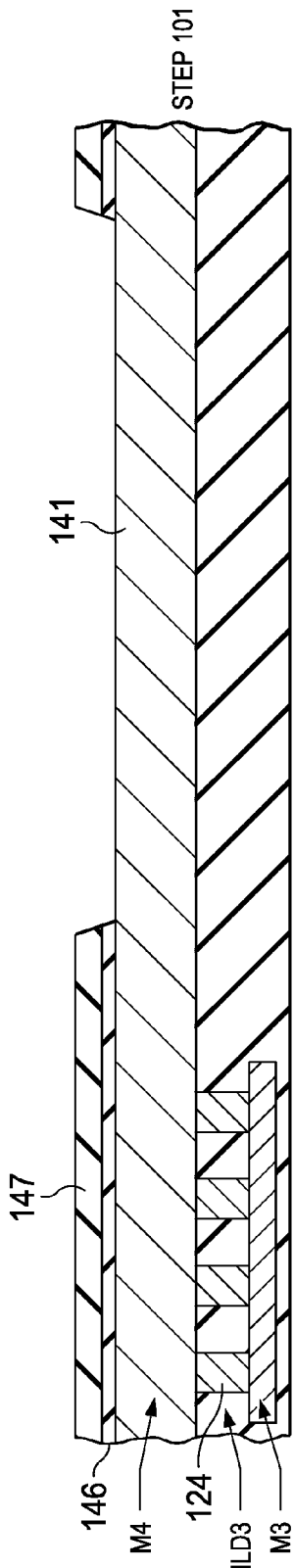

The plurality of bond pads each include a metal bond pad area. Optionally, there can be at least one passivation layer thereon that provides a trench including dielectric sidewalls above the metal bond pad area that defines the exposed bond pad area. FIG. 2A is an example cross section depiction corresponding to the structure provided in step 101. M3 can be aluminum that connects to M4 also being aluminum being the oxidizable uppermost metal interconnect layer by the vias 124 formed in third inter-layer dielectric layer shown as ILD3. The dielectric passivation layer is shown as 146/147 (e.g., silicon nitride or silicon oxynitride on silicon oxide).

The substrate can comprise silicon, silicon-germanium, or other semiconductor materials including III-V or II-VI materials. The uppermost metal interconnect layer (shown as a RDL M4 (hereafter M4) in FIGS. 2A-2F) can comprise copper or aluminum, or alloys thereof, a non-solderable pad material such as Ti metal, or a Ti compound material such as TiN, TiW, or $TiAl_3$. In one embodiment the uppermost metal interconnect layer comprises primarily aluminum by weight, and in another embodiment the uppermost metal interconnect layer comprises primarily copper by weight.

Step 102 comprises depositing a cobalt comprising connection layer directly on the metal bond pad areas. The cobalt comprising connection layer can comprise essentially all (≥99% by weight) cobalt, or a cobalt alloy including cobalt together with at least one transition metal, such as another transition metal (e.g., Pt) in a concentration from 2 wt. % to 60 wt. %, or another other transition metal that does not form a dielectric layer such as an oxide or nitride from the soldering process conditions which also provides good solder adhesion.

When there is a dielectric passivation layer that provides a trench around the bond pads including dielectric sidewalls, the cobalt comprising connection layer is also generally directly on the dielectric sidewalls of the trench. By extending the cobalt comprising connection layer to the adjacent planar part of the passivation layer, the cobalt comprising connection layer provides a capping layer which provides corrosion protection for the metal pad material (see FIG. 2D described below), such as aluminum. As used herein, the cobalt comprising connection layer being "directly on the metal bond pad area" includes the conventional contact arrangement where the uppermost metal interconnect layer has a native oxide layer formed at room temperature that can be up to about 2 nm thick, such as being primarily aluminum oxide in the case of aluminum and $Cu_2O$ in the case of copper. The direct cobalt comprising connection layer attachment removes the need for a barrier layer on the metal pad material (e.g., aluminum).

The cobalt comprising connection layer can be sputter deposited using a cobalt sputtering target for sputter coating on the substrate (e.g., wafer) surface. The cobalt sputtering can be performed at a relatively low temperature, such as from 25° C. to 300° C. The thickness of the cobalt comprising connection layer is generally 100 Angstroms (A) to 4 µm, such as from 0.1 µm to 1 µm thick. It is also possible for the cobalt comprising connection layer to be thicker, such as from 4 µm to 10 µm.

Figure 2B:
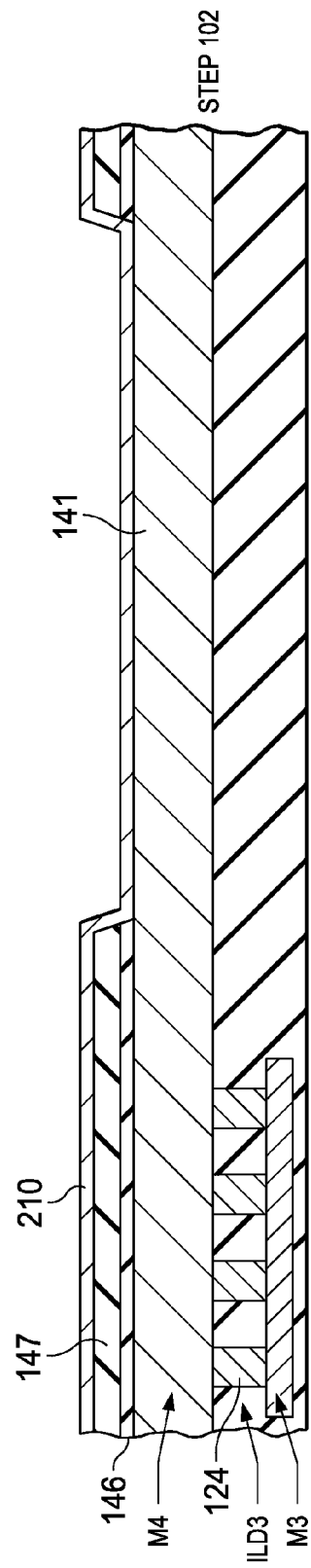

FIG. 2B is an example cross section depiction corresponding the structure after step 102. The cobalt comprising connection layer is shown as 210. Prior to depositing the cobalt comprising connection layer 210, the method can include removing the native oxide on a surface of the oxidizable uppermost metal interconnect layer with a sputter etch method (plasma process), such as aluminum oxide in the case of aluminum, so that the native oxide under the cobalt comprising connection layer may be <5 A thick.

Step 103 comprises patterning the cobalt comprising connection layer 210 to provide a cobalt bond pad surface on the plurality of bond pads. A wet etch using a photoresist making pattern may be used for the patterning, including removing all but the bond pad edges of the overburden cobalt comprising connection layer above the top of the passivation layer(s) when present while preserving the cobalt comprising connection layer within the bond pad area. An example wet cobalt etch comprises phosphoric acid and nitric acid, or related acid mixtures.

Figure 2E:
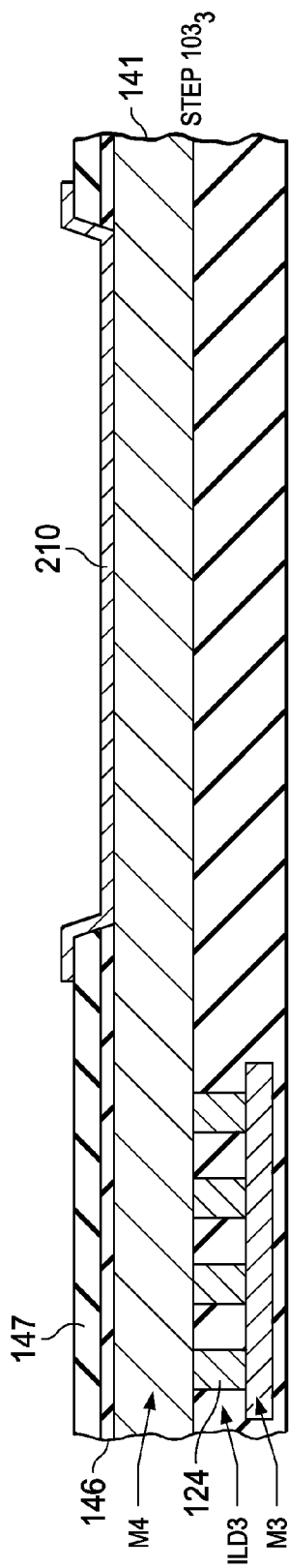

FIG. 2C is an example cross section depiction corresponding the structure after the masking portion of step 103 shown to the right in FIG. 2C as step $103_1$ showing a patterned masking material 251 such as photoresist. FIG. 2D is an example cross section depiction corresponding the structure after the cobalt etch portion of step 103 shown to the right in FIG. 2D as step $103_2$ showing the cobalt comprising connection layer 210 now being a patterned layer. FIG. 2E is an example cross section depiction corresponding the structure after stripping the masking material 251 after the cobalt etch portion of step 103 shown to the right in FIG. 2E as step $103_3$.

Figure 2F:
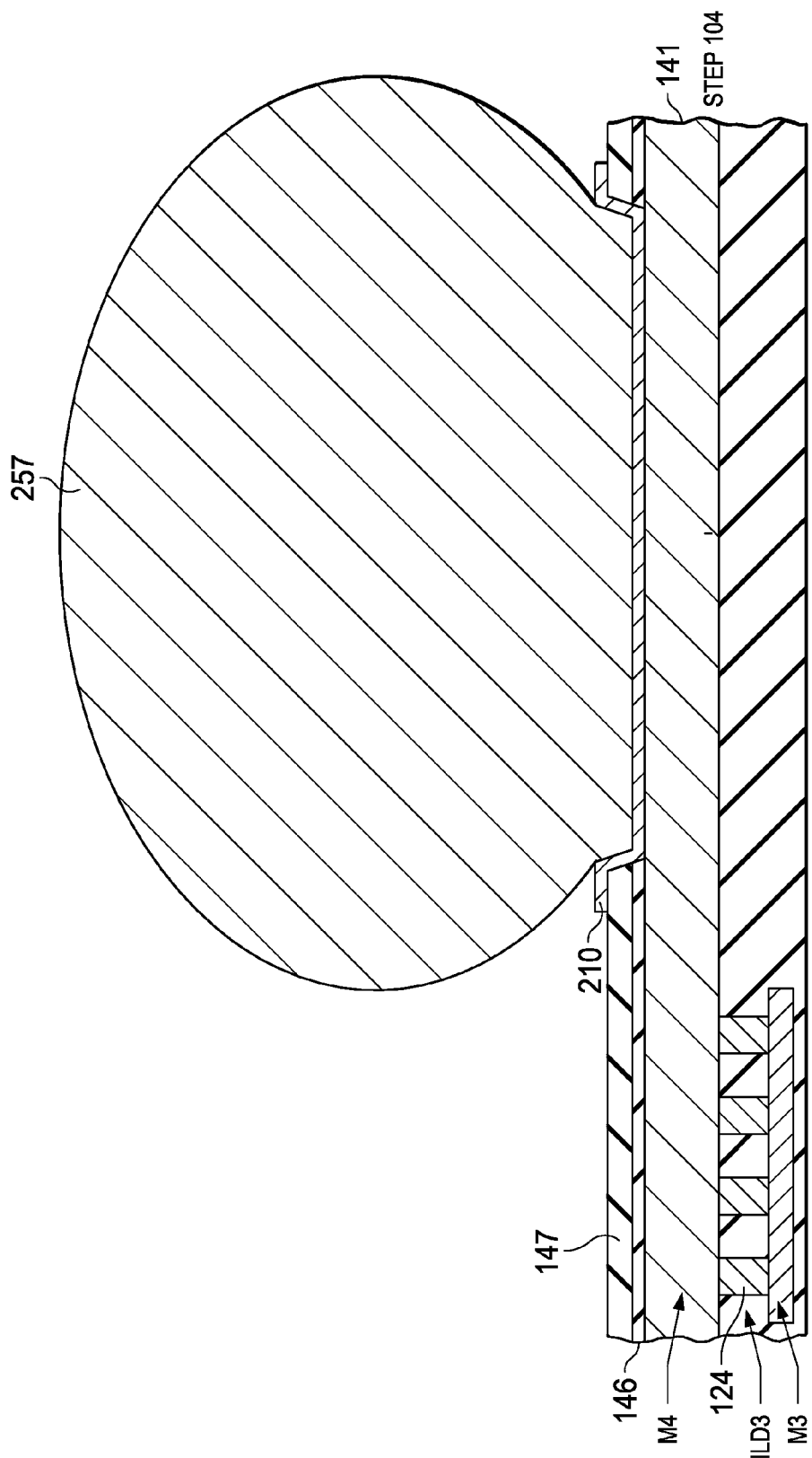

Step 104 comprises forming a solder material on the cobalt bond pad surface. As used herein a "solder material" refers to a fusible metal alloy used to join together metal workpieces that has a melting point below 450° C. Step 104 may comprise a conventional soldering process, such as a conventional flux+stencil+place+solder process. The solder material may be formed directly on the cobalt bond pad surface. Typical solder materials generally include Sn and Ag, and are generally in the form of a solder bump or ball. Example particular solders compositions all found to be well-suited for proving good adherence and a low resistance contact to the cobalt comprising connection layer include Sn96.5Ag3Cu0.5, Sn63Pb37, and SnPb(35.6)Ag(2)Sb(0.4). FIG. 2F is an example cross section depiction corresponding the structure after directly forming of the solder material shown as a solder ball 257 on the cobalt bond pad surface shown to the right in FIG. 2F as step 104.

Figure 3:
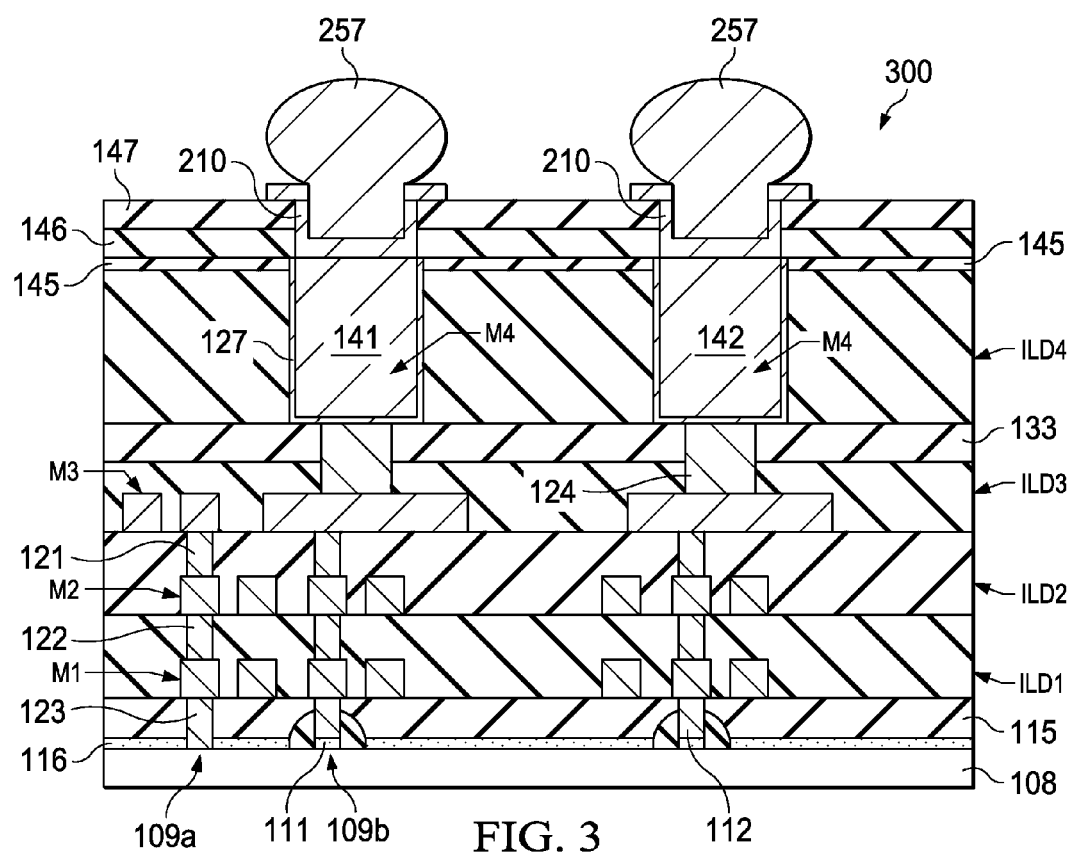
FIG. 3 is a cross sectional view of an example IC device including example bond pads having a cobalt comprising connection layer directly on the metal bond pad areas, and also optionally directly on the sidewalls of a dielectric passivation trench, according to an example embodiment.

FIG. 3 is a cross sectional view of an IC device 300 including example bond pads having a cobalt comprising connection layer 210 directly on the metal bond pad areas of the oxidizable uppermost metal interconnect layer and optionally also directly on the dielectric sidewalls of the trench, according to an example embodiment. The metal stack is shown including three (3) layers of metal interconnect shown as M1, M2 and M3 damascened into ILD1, ILD2, and ILD3, respectively, on a dielectric layer over the top semiconductor surface that may be referred to as a pre-metal dielectric (PMD) 115 that is on another dielectric layer 116, such as a thermally grown silicon oxide layer. An uppermost fourth metal interconnect layer shown as M4 functions as an RDL which provides a plurality of bond pad metal areas shown as metal bond pad area 141 and metal bond pad area 142. A dielectric layer shown as 133 is on ILD3 that provides an etch stop, such as comprising silicon nitride.

Plugs 121 are shown coupling M3 to M2, plugs 122 coupling M2 to M1, and plugs 123 coupling M1 to node 109a shown as a diffusion (e.g., n+ or p+) and to 109b shown as a gate electrode node (circuitry not shown, with 109b being a contact to a metal oxide semiconductor (MOS) gate 112 on a gate dielectric 111 on the semiconductor surface of a substrate 108, such as a silicon comprising surface in one embodiment. The plugs 121, 122, 123 and 124 can all comprise tungsten, or other suitable electrically conductive plug material.

M4 comprises an oxidizable metal material such as aluminum shown formed into ILD4. The barrier layer 127 shown is not needed for M4 being aluminum, but may be included for M4 comprising copper, such as barrier layer 127 comprising Ta, TaN, Ti or TiN. Metal bond pad areas 141 and 142 are shown coupled by plug 124 though dielectric layer 133 and ILD3 to M3, and from M3 all the way to features on the semiconductor surface, such as from metal bond pad area 141 to node 109b.

IC device 300 includes at least one dielectric passivation layer(s) which defines a trench over the metal bond pad areas 141 and 142, with the passivation shown in FIG. 3 being a first dielectric layer 147 (e.g., silicon nitride or silicon oxynitride) on a second dielectric layer 146 (e.g., silicon oxide or silicon oxynitride) on an etch stop layer 145 (e.g., silicon nitride). A cobalt comprising connection layer 210 directly contacts the dielectric sidewalls of the trench and is directly connected to the top surface of the metal bond pad areas 141 and 142, so that there is no conventional intervening barrier layer, typically being a refractive metal comprising barrier layer. Solder balls 257 are shown directly on the cobalt bond pad surface provided by the cobalt comprising connection layer 210. As noted above disclosed embodiments recognize a cobalt comprising connection layer provides strong adhesion to dielectric layers such as silicon oxide and silicon nitride, which enables direct connection of the cobalt comprising connection layer and thus elimination of conventional barrier layer processing needed for proper adhesion to dielectric layers such as silicon oxide and silicon nitride, such as needed by conventional metals.

Optionally, a layer of another electrically conductive material may be positioned on the cobalt comprising connection layer. IC devices having disclosed cobalt bond pad surfaces directly on the metal bond pad area of the uppermost metal interconnect layer will generally reduce back end of the line (BEOL) processing cost and cycle time, such as by eliminating the need for bilayer UBM and electroplated RDL. Advantages further include because of the ability to utilize a relatively thin cobalt connection layer (which can be less than 1 µm thick), the solder material (e.g., solder ball) can be placed directly on the bond pad. Because of the reduced cobalt comprising connection layer thickness the stack height of the cobalt comprising connection layer plus the solder on the bond pad is reduced which is beneficial for height limited applications.

Disclosed embodiments can be integrated into a variety of assembly flows to form a variety of different semiconductor IC devices and related products. The assembly can comprise single semiconductor die or multiple semiconductor die, such as (Package on Package) (PoP) configurations comprising a plurality of stacked semiconductor die. A variety of package substrates may be used. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, insulated-gate bipolar transistor (IGBT), CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure. For example, it may be possible to substitute certain transitional metals or metal alloys such as Pt for Co provided they do not form a dielectric layer such as an oxide or nitride from the soldering process conditions and provide good solder adhesion.

The invention claimed is:

1. A method of forming an integrated circuit, comprising:
providing a substrate including at least one integrated circuit (IC) device formed thereon having an oxidizable uppermost metal interconnect layer which provides a plurality of bond pads coupled to circuit nodes on said IC device, said plurality of bond pads including a metal bond pad area;
depositing a cobalt comprising connection layer directly on said metal bond pad area;
patterning said cobalt comprising connection layer to provide a cobalt bond pad surface on said plurality of bond pads; and
forming a solder material directly on said cobalt bond pad surface of the cobalt comprising connection layer to form a three layer stack of the solder material directly on the cobalt comprising connection layer directly on the oxidizable uppermost metal interconnect layer.

2. The method of claim 1, wherein said providing said substrate further includes at least one patterned passivation layer defining a trench including dielectric sidewalls above said metal bond pad area, and wherein said cobalt comprising connection layer extends directly over said dielectric sidewalls onto said passivation layer to completely cap said metal bond pad area.

3. The method of claim 1, wherein said depositing comprises sputtering, further comprising before said sputtering removing native oxide on a surface of said uppermost metal interconnect layer using a sputter etch comprising method.

4. The method of claim 1, wherein said uppermost metal interconnect layer comprises primarily aluminum by weight.

5. The method of claim 1, wherein said solder material comprises a solder ball that comprises Sn and Ag.

6. The method of claim 1, wherein said uppermost metal interconnect layer comprises primarily copper by weight, titanium, or a titanium compound material.

7. The method of claim 1, wherein said patterning said cobalt comprising connection layer comprises patterning a photoresist layer on said cobalt comprising connection layer, and then wet etching said cobalt comprising connection layer.

8. The method of claim 1, wherein said cobalt comprising connection layer comprises at least one non-cobalt transition metal in a concentration from 2 wt. % to 60 wt. %.

9. The method of claim 1, wherein a thickness of said cobalt comprising connection layer is between 100 Angstroms and 2 µm thick.

10. The method of claim 1, wherein said cobalt comprising connection layer includes at least 99% cobalt by weight.

11. A method of forming an integrated circuit, comprising:
providing a substrate including at least one integrated circuit (IC) device formed thereon having an uppermost metal interconnect layer which provides a plurality of bond pads coupled to circuit nodes on said IC device, said plurality of bond pads including a metal bond pad area comprising primarily aluminum;
depositing a cobalt comprising connection layer directly on said aluminum metal bond pad area;

patterning said cobalt comprising connection layer to provide a cobalt bond pad surface on said plurality of bond pads; and forming a solder ball directly on the cobalt bond pad surface of the cobalt comprising connection layer to form a three layer stack of the solder ball directly on the cobalt comprising connection layer which is directly on the aluminum of the uppermost metal interconnect layer, wherein the solder ball comprises Sn and Ag.

12. The method of claim 11, wherein said providing said substrate further includes at least one patterned passivation layer defining a trench including dielectric sidewalls above said metal bond pad area, and wherein said cobalt comprising connection layer extends directly over said dielectric sidewalls onto said passivation layer to completely cap said metal bond pad area.

13. The method of claim 11, wherein said depositing comprises sputtering, further comprising before said sputtering removing native oxide on a surface of said uppermost metal interconnect layer using a sputter etch comprising method.

14. The method of claim 11, wherein said patterning said cobalt comprising connection layer comprises patterning a photoresist layer on said cobalt comprising connection layer, and then wet etching said cobalt comprising connection layer.

15. The method of claim 11, wherein said cobalt comprising connection layer comprises at least one non-cobalt transition metal in a concentration from 2 wt. % to 60 wt. %.

16. The method of claim 11, wherein a thickness of said cobalt comprising connection layer is between 100 Angstroms and 2 μm thick.

17. The method of claim 11, wherein said cobalt comprising connection layer includes at least 99% cobalt by weight.

* * * * *